United States Patent
Furman et al.

(10) Patent No.: US 7,482,197 B2
(45) Date of Patent: Jan. 27, 2009

(54) METHOD AND APPARATUS FOR DEPLOYING A LIQUID METAL THERMAL INTERFACE FOR CHIP COOLING

(75) Inventors: Bruce K. Furman, Poughquag, NY (US); Yves C. Martin, Ossining, NY (US); Theodore G. Van Kessel, Millbrook, NY (US)

(73) Assignee: International Business Machines Corporation, Armonk, NY (US)

( * ) Notice: Subject to any disclaimer, the term of this patent is extended or adjusted under 35 U.S.C. 154(b) by 462 days.

(21) Appl. No.: 11/220,878

(22) Filed: Sep. 6, 2005

(65) Prior Publication Data
US 2007/0238282 A1    Oct. 11, 2007

Related U.S. Application Data

(60) Provisional application No. 60/637,100, filed on Dec. 17, 2004, provisional application No. 60/637,117, filed on Dec. 17, 2004.

(51) Int. Cl.
*H01L 21/44* (2006.01)
*H01L 21/48* (2006.01)
*H01L 21/50* (2006.01)

(52) U.S. Cl. ............... 438/106; 438/118; 438/122; 257/E21.023; 257/E21.051; 257/E21.499

(58) Field of Classification Search ............... 438/104, 438/106, 111, 118, 119, 122, 683, 685, 686, 438/687
See application file for complete search history.

(56) References Cited

U.S. PATENT DOCUMENTS

| | | | | |
|---|---|---|---|---|
| 5,170,930 A | * | 12/1992 | Dolbear et al. | 228/123.1 |
| 5,445,308 A | * | 8/1995 | Nelson et al. | 228/121 |
| 6,301,109 B1 | | 10/2001 | Chu et al. | |
| 6,891,259 B2 | * | 5/2005 | Im et al. | 257/687 |
| 2005/0155752 A1 | * | 7/2005 | Larson et al. | 165/185 |
| 2006/0097384 A1 | * | 5/2006 | Hamann et al. | 257/714 |
| 2006/0131738 A1 | * | 6/2006 | Furman et al. | 257/720 |

FOREIGN PATENT DOCUMENTS

WO    WO-2004/075291 A1    9/2004

OTHER PUBLICATIONS

R.R. Schmidt, B.D. Notohardjono, "High-end Server Low-temperature Cooling", IBM Technical Disclosure Bulletin, Nov. 2002, pp. 739-751.

* cited by examiner

*Primary Examiner*—David Nhu

(57) ABSTRACT

In one embodiment, the present invention is a method and apparatus for chip cooling. One embodiment of an inventive method for bonding a liquid metal to an interface surface (e.g., a surface of an integrated circuit chip or an opposing surface of a heat sink) includes applying an adhesive to the interface surface. A metal film is then bonded to the adhesive, thereby easily adapting the interface surface for bonding to the liquid metal.

19 Claims, 2 Drawing Sheets

METHOD AND APPARATUS FOR DEPLOYING A LIQUID METAL THERMAL INTERFACE FOR CHIP COOLING

CROSS REFERENCE TO RELATED APPLICATIONS

This application claims the benefit of U.S. Provisional Patent Application Ser. No. 60/637,100, filed Dec. 17, 2004 by Furman et al. and U.S. Provisional Patent Application Ser. No. 60/637,117, also filed Dec. 17, 2004 by Furman et al., both of which are herein incorporated by reference in their entireties.

REFERENCE TO GOVERNMENT FUNDING

The present invention was made with Government support under Contract No. H98230-04-C-0920, awarded by the Maryland Procurement Office. The Government has certain rights in this invention.

BACKGROUND

The invention relates generally to semiconductor devices, e.g., integrated circuits, and relates more particularly to the cooling of integrated circuit chips. Specifically, the present invention relates to a thermal interface for chip cooling.

Efficient cooling of integrated circuit (IC) devices is essential to prevent failure due to excessive heating. Efficient cooling of the IC chips depends in large part on good contact between the chips and the heat sinks or thermal spreaders, because a major part of the heat resistance budget is expended between the chip and the heat sink.

Conventionally, heat transfer between a chip and a heat sink is facilitated by providing a thin layer of thermally conductive paste or grease disposed between opposing surfaces of the chip and the heat sink unit. Typically, the layer of paste is approximately 100 microns thick and is mechanically compliant to conform to the sometimes irregular surfaces of the chip and heat sink.

Such conductive pastes have generally proven to be reliable in facilitating heat transfer; however, the thermal conductivity of conventional pastes is typically limited (e.g., typical pastes have a thermal resistance of approximately 10 to 100 $mm^2$-$°$C./W). Thus, these pastes are only practical for use with relatively low-power IC chips. Moreover, heavy thermal cycling may cause non-uniform behavior in conventional pastes, or may cause conventional pastes to fail to thermally bond the chip to the heat sink, resulting in thermal run-away and also limiting chip cooling.

Thus, there is a need for a thermal interface that is capable of establishing reliable thermal contact, and of providing sufficient thermal conductivity and mechanical compliance between a semiconductor device and a heat sink.

SUMMARY OF THE INVENTION

In one embodiment, the present invention is a method and apparatus for chip cooling. One embodiment of an inventive method for coupling or bonding a liquid metal material to an interface surface (e.g., a surface of an integrated circuit chip or an opposing surface of a heat sink) includes applying an adhesive to the interface surface. A metal film is then bonded to the adhesive, thereby easily adapting the interface surface for bonding to the liquid metal material. The metal film and adhesive are adapted to facilitate adhesion of the liquid metal material to the integrated circuit chip and/or to the heat sink, as well as to provide good wetting with respect to the liquid metal material and to provide a barrier that isolates the liquid metal material from the integrated circuit chip and/or heat sink materials.

BRIEF DESCRIPTION OF THE DRAWINGS

So that the manner in which the above recited embodiments of the invention are attained and can be understood in detail, a more particular description of the invention, briefly summarized above, may be obtained by reference to the embodiments thereof which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures.

DETAILED DESCRIPTION

In one embodiment, the present invention is a liquid metal thermal interface that facilitates improved thermal contact between a semiconductor device (e.g., an IC chip) and a heat sink over conventional conductive paste interfaces. The thermal interface is assembled in a manner that substantially prevents reactions between materials in the liquid metal and materials in the IC chip and/or heat sink (e.g., such as corrosion of heat sink materials), as well as adheres the liquid metal to the surfaces of the IC chip and/or heat sink and achieves sufficient wetting of the IC chip and heat sink surfaces (wetting of the IC chip more significant than wetting of the heat sink in many embodiments). Thus, the thermal interface of the present invention makes deployment of the liquid metal a practical interface solution.

Figure 1:
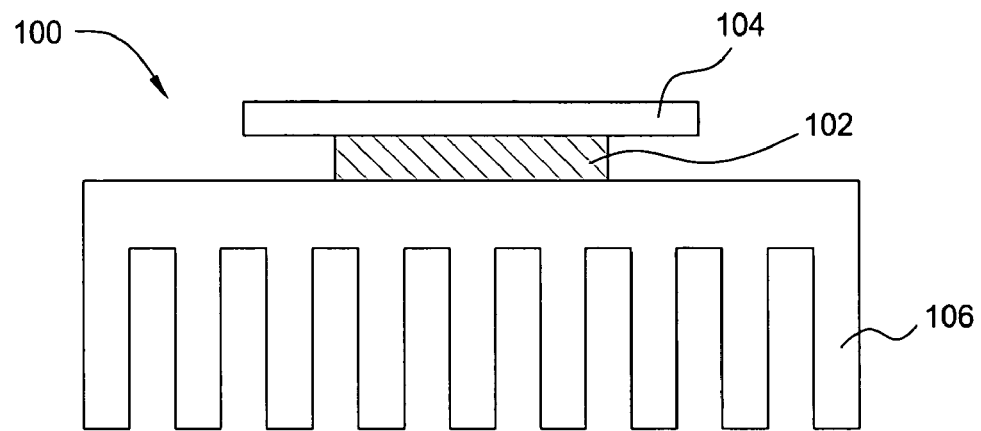
FIG. 1 is a schematic diagram illustrating one embodiment of a system in which a thermal interface according to the present invention is deployed.

FIG. 1 is a schematic diagram illustrating one embodiment of a system 100 in which a thermal interface 102 according to the present invention is deployed. As illustrated, the thermal interface 102 is deployed between opposing surfaces of an IC chip 104 and a heat sink 106 in order to provide good thermal contact between the IC chip 104 and the heat sink 106. The heat sink 106 may be any kind of thermal heat sink or spreader, including an air-cooled fin assembly, a liquid-cooled assembly, a heat pipe assembly, a vapor chamber and the like. In one embodiment, the thermal interface 102 includes a thermally conductive liquid metal material, as described in further detail below. In alternative embodiments, the thermal interface 102 may be a solder thermal interface.

Figure 2:
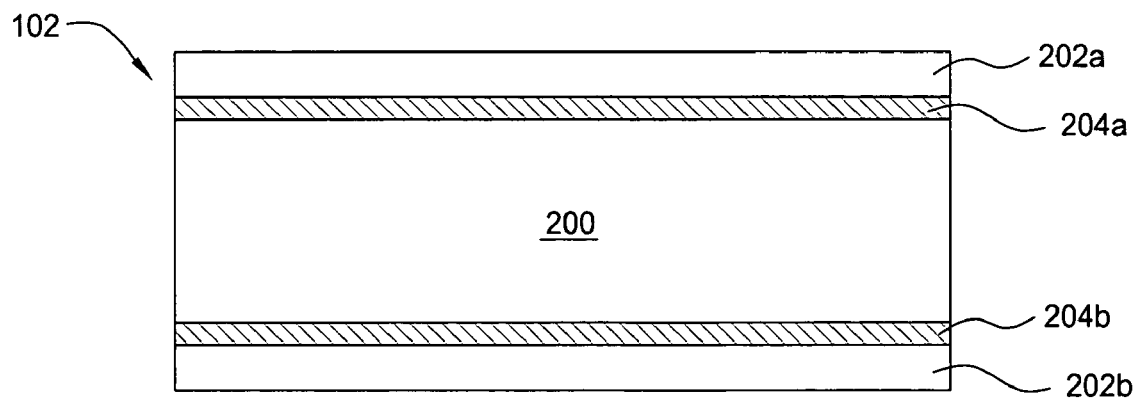
FIG. 2 is a cross-sectional view of the thermal interface illustrated in FIG. 1.

FIG. 2 is a cross-sectional view of the thermal interface 102 illustrated in FIG. 1. In one embodiment, the thermal interface 102 includes a thermally conductive liquid metal layer 200 disposed between a first barrier layer 202a in contact with a first surface of the liquid metal layer 200 and a second barrier layer 202b in contact with an opposite second surface of the liquid metal layer 200 (hereinafter collectively referred to as "barrier layers 202").

The liquid metal layer 200 is adapted to facilitate good thermal contact between the opposing surfaces of the IC chip 104 and the heat sink 106. The liquid metal layer 200 comprises a metal (or metal alloy) that is a liquid at least in the range of typical IC chip operation temperatures (e.g., approximately 20° C. to 100° C.), and in one embodiment comprises a gallium-indium-tin alloy that has an even higher thermal conductivity (approximately 30 W/m-K) than conventional conductive pastes. In further embodiments materials may be substituted or added to the liquid metal alloy in order to adjust one or more properties of the liquid metal alloy, such as its melting point, corrosion resistance, conductivity or wetting. For example, materials including, but not limited to, zinc, bismuth, platinum, palladium, manganese, magnesium, copper, silver or gold may be added or may substitute for different materials.

In further embodiments still, the liquid metal layer 200 comprises a gallium-indium-tin alloy that is mixed with inert particles (e.g., organic particles such as tungsten, carbon, diamond, silicon dioxide, silicon carbide, chromium, titanium, molybdenum, gallium oxide, tin oxide, indium oxide, plastic tantalum and the like) to enhance the viscosity of the liquid metal layer 200. For example, ten weight percent of approximately two micron size tungsten particles may be combined with the gallium-indium-tin alloy to produce a more viscous, slurry-like liquid metal layer 200 that is easier to apply and more easily contained. In other embodiments, the type, size and weight percent of inert particles added to the gallium-indium-tin alloy is dependent upon the goals of the specific application (e.g., desired bond line, etc.). Additionally, anti-corrosive materials such as zinc, palladium, platinum, gold, manganese and magnesium may be added to the gallium-indium-tin alloy in small amounts in order to adjust corrosion properties of the gallium-indium-tin alloy.

In one embodiment, the liquid metal layer 200 has a thickness of approximately ten to one hundred microns. In other embodiments, the thickness of the liquid metal layer will depend upon the desired thermal resistance and/or on the mechanical tolerances of the components. Typically, the thickness of the liquid metal layer 200 is directly proportional to the thermal resistance. For example, in one embodiment, the liquid metal layer 200 is approximately thirty microns thick and corresponds to a thermal resistance of approximately two $mm^2$-° C./W.

The barrier layers 202 are adapted to bond the liquid metal layer 200 to the opposing surfaces of the IC chip 104 and the heat sink 106 while substantially preventing reactions between components of the liquid metal layer 200 and components of the IC chip 104 and the heat sink 106 (e.g., such as corrosion of heat sink 106). In one embodiment, the barrier layers 202 are applied directly to the opposing surfaces of the IC chip 104 and the heat sink 106 (e.g., by evaporation, sputtering, plating, bonding and the like). The barrier layers 202 are at least partially formed of a metal-containing material that has a low solubility in the constituents of the liquid metal layer 200 (e.g. gallium, indium and tin) and is chemically unreactive. For the purposes of the present invention, a material that has a "low solubility" in the constituents of the liquid metal layer 200 is a material that has a low enough solubility in the liquid metal layer 200 that the material can reasonably be expected to maintain its integrity over time within a temperature range of interest.

In one embodiment, the materials that form the barrier layers 202 also adhere well to copper, aluminum, silicon, silicon nitride and silicon dioxide (e.g., common heat sink and/or IC chip materials). In one embodiment, the barrier layers 202 are at least partially formed of a material containing at least one of: chromium, tantalum, titanium, tungsten, molybdenum and nickel. In further embodiments, the barrier layers 202 are at least partially formed of a material containing an oxide or nitride such as: silicon oxide, silicon nitride, silicon carbide, titanium nitride, and tantalum nitride. In such cases, it may be desirable to include an additional adhesion layer (e.g., chromium) deposited on the interface surfaces between the nitride or oxide barrier layer 202 and the interface surfaces (e.g., deposited on the interface surfaces prior to applying the barrier layer 202). In one embodiment, the barrier layers 202 each have a thickness of approximately 2000 to 5000 Angstroms.

In one embodiment, the thermal interface 102 further includes at least one wetting layer 204a or 204b (hereinafter collectively referred to as "wetting layers 204") disposed between the liquid metal layer 200 and one or both of the barrier layers 202. The wetting layers 204 are adapted to facilitate a metal-to-metal bond between the liquid metal layer 200 and the barrier layers 202. The wetting layers 204 are at least partially formed of a small quantity of material that optionally dissolves partially or completely in the constituents of the liquid metal layer 200 (e.g., gallium, indium and tin) to permit a direct, robust metal bond between the liquid metal layer 200 and the barrier layers 202.

In an alternative embodiment, the wetting layers 204 may be at least partially formed of a material that wets directly (such as silicon carbide, silicon nitride or silicon oxide), instead of a material that facilitates a metal-to-metal bond between the liquid metal layer 200 and the barrier layers 202, as described above. In the context of the present invention, a material that "wets directly" is a material that has good surface energy with respect to the liquid metal material such that a wetting layer that facilitates a metal-to-metal bond is not necessary.

Moreover, contents of the wetting layers 204 should be selected from a group of materials that do not adversely affect the function of the liquid metal layer 200, e.g., by reacting chemically with or altering the alloy properties of the liquid metal material. In one embodiment, the wetting layers 204 are directly applied to the barrier layers 202 in a manner that substantially prevents oxides from forming on the barrier layers 202 (e.g., by sputtering). In one embodiment, the wetting layers 204 are at least partially formed of at least one noble metal (e.g., platinum or gold) that dissolves into the liquid metal layer 200 on contact, permitting a direct metallic bond between the liquid metal layer 200 and the barrier layers 202. In one embodiment, each of the wetting layers 204 has a thickness that is small enough to avoid adversely affecting the properties of the liquid metal material. In one embodiment, the thickness of the wetting layers 204 is approximately 300 hundred Angstroms, but could potentially be thinner or thicker as necessary. For example, the surface roughness of the IC chip or heat sink surface may dictate the thickness of the wetting layer 204 (e.g., a rougher surface might require a thicker wetting layer 204 that a smooth surface would, in order to achieve an oxygen impervious coating).

In one embodiment, at least one of the barrier layers 202 and the corresponding wetting layer 204 could be formed as a single, combination barrier and wetting layer, for example formed at least partially of chromium or nickel.

Those skilled in the art will appreciate that in some embodiments, the first barrier layer 202a and the second barrier layer 202b, as well as the individual wetting layers 204, may comprise different materials and thicknesses depending upon whether the layer(s) in question are adapted to interface with the IC chip 104 or with the heat sink 106.

Those skilled in the art will recognize that a variety of methods may be implemented for laterally confining the liquid metal layer 200 (e.g., to prevent the liquid metal material from "leaking"). In one embodiment, lateral confinement of the liquid metal layer 200 is accomplished by small gap capillary action. In another embodiment, the liquid metal layer 200 is laterally confined by a gasket interposed between or against the IC chip 104 and the heat sink 106. In yet another embodiment, the first and second barrier layers 202 are joined at the edges to form an enclosure to contain the liquid metal layer 200.

The present invention thereby provides a practical liquid metal thermal interface 102 that is easily deployed between an IC chip 104 and a heat sink 106. The barrier layers 202 prevent the material in the liquid metal layer 200 from reacting with the materials that make up the heat sink 106 and the IC chip 104. Moreover, the wetting layers 204 easily dissolve into the liquid metal layer 200, thereby facilitating direct metal-to-metal contact between the liquid metal layer 200 and the barrier layers 202. Thus, the liquid metal thermal interface 102 can be deployed in a manner that avoids adverse chemical reactions with and achieves sufficient wetting of both the IC chip 104 and the heat sink 106, while providing improved thermal contact over conventional conductive pastes.

For example, in one embodiment, an approximately 2000 Angstrom barrier layer 202 formed of chromium is sputtered onto the IC chip 104 and/or heat sink 106 and subsequently sputter coated with a wetting layer 204 comprising approximately 300 Angstroms of gold or platinum to prevent surface oxidation. The liquid metal layer 200 is then deployed between the coated IC chip 104 and heat sink 106. In one embodiment, this configuration achieves robust performance over temperature ranges up to approximately 150° C.

In another embodiment, approximately 300 Angstroms of chromium, 2500 Angstroms of titanium, tungsten, or tantalum nitride-coated tantalum, and 300 Angstroms of platinum or gold are successively sputtered onto the surface of the IC chip 104 and/or heat sink 106. In one embodiment, this configuration provides enhanced resistance to gallium, indium and tin diffusion at high temperatures (e.g., temperatures in excess of approximately 150° C.

However, those skilled in the art will appreciate that selected methods for coating the surfaces of the IC chip 104 and heat sink 106 with the barrier and/or wetting layers 202 and 204, as well as the selected thicknesses of the barrier and wetting layers 202 and 204, are typically application-dependent. That is, coating methods and thicknesses typically will depend on deposition stresses in the barrier and wetting layers 202 and 204 and on desired coating uniformity. For example, if surface of the IC chip 104 or heat sink 106 is rough, the barrier and/or wetting layers 202 and 204 may be applied by sputtering to achieve a substantially uniform coating. Application by sputtering also tends to cause less stress in the film than other application methods. In some embodiments, a thin seed layer for a barrier and/or wetting layer 202 and 204 may be applied in accordance with an appropriate coating method, followed by a thicker layer plated thereon.

Figure 3:
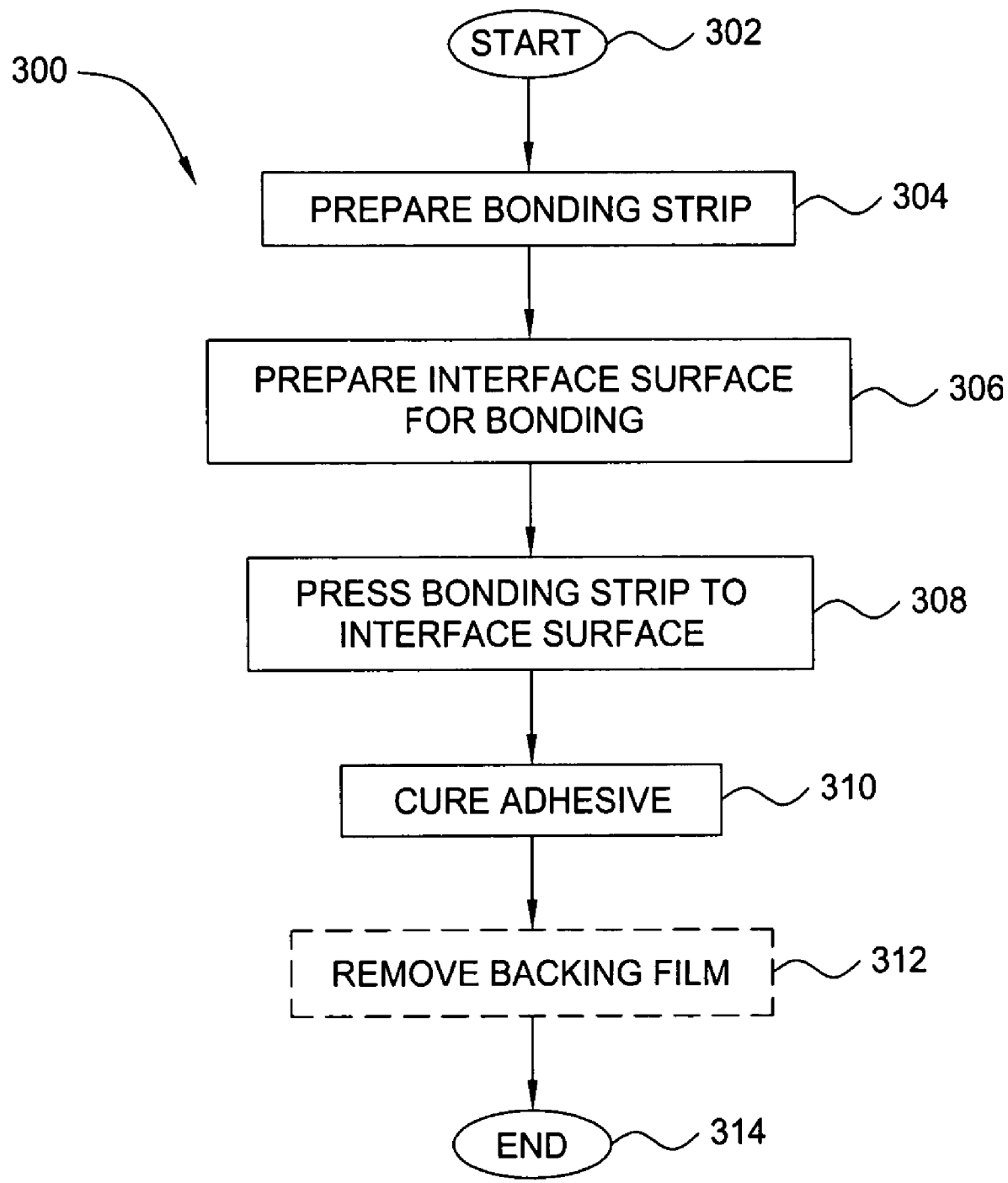
FIG. 3 is a flow diagram illustrating one embodiment of a method for applying at least part of a liquid metal (or solder) thermal interface, such as the thermal interface illustrated in FIGS. 1 and 2, to a surface of an IC chip or heat sink.

FIG. 3 is a flow diagram illustrating one embodiment of a method 300 for applying at least part of a liquid metal (or solder) thermal interface, such as the thermal interface 102 illustrated in FIGS. 1 and 2, to a surface of an IC chip or heat sink. Specifically, FIG. 3 illustrates a method 300 for applying a barrier and/or wetting layer to an interface surface (e.g., the surface of the IC chip 104 or the heat sink 106 that is to be interfaced via the thermal interface 102). The method 300 is initialized at step 302 and proceeds to step 304, where a bonding strip comprising a wetting layer 204 (e.g., comprising a wetting material such as platinum or gold) and/or a barrier layer 202 (e.g., comprising a barrier material such as titanium, tantalum, tungsten, chromium or nickel) is prepared. In one embodiment, a bonding strip is formed by successively evaporating a welling layer 204 and a barrier layer 202 onto a polymer backing film (e.g., a polyethylene terephthalate film such as Mylar® of EI Dupont de Nemours & Company or a polytetrafluoroethylene film such as Teflon®, also of EI Dupont de Nemours & Company) to form a two-layer metal film that coats at least a portion of the polymer backing film. In an alternative embodiment, a combination barrier/wetting layer or metal film (e.g. comprising chromium) is evaporated onto the polymer backing film to form a single-layer metal film. In one embodiment, the thickness of the metal film is on the order of at least approximately 1000 Angstroms.

In yet another alternative embodiment, a bonding strip is formed by stripping a barrier foil (e.g., a metal foil formed of a barrier material) of oxides and then coating a surface of the stripped foil with a wetting material to form a two-layer metal film. In one embodiment, the metal film has a thickness of approximately one to twenty microns.

In one embodiment, the barrier layer of the bonding strip is further coated with an adhesion promoter (e.g., an organic adhesion promoter such as a commercially available silated or non-silated promoter).

In step 306, the interface surface of the IC chip 104 or the heat sink 106 is prepared for bonding. In one embodiment, preparation of the interface surface involves applying an adhesive to the interface surface. In one embodiment, the applied adhesive is a material that facilitates good adhesion of the interface surface to the bonding strip, that is stable, that is capable of forming a thin (e.g., as thin as sub-micron) bond line, and that can tolerate elevated temperatures (e.g., up to approximately 250° C.) to allow solder reflow operations. In one embodiment, the adhesive comprises a commercially available low viscosity acrylate or epoxy or a low-melt solder (e.g., an indium-based solder). In further embodiments, an adhesion promoter having one or more of the same requisite properties as the adhesive itself may be applied to the interface surface prior to applying the adhesive.

In step 308, the bonding strip (e.g., the coated polymer backing film or the coated barrier foil) is pressed to the interface surface so that the barrier layer 204 of the metal film on the bonding strip contacts the adhesive on the interface surface. In one embodiment, the adhesive is pressed to a bond line of approximately 1000 Angstroms (e.g., by rolling or other suitable means). A small bond line allows the interface to retain high thermal conductivity.

In step 310, the adhesive is cured (e.g., by heat, light or a thermal reflow cycle), bonding the barrier layer (and corresponding wetting layer) directly to the interface surface. In one embodiment, the adhesive is cured at a temperature of at least approximately 250° C. In one embodiment (e.g., where the bonding strip comprises a coated polymer backing film) the method 300 proceeds to step 312 and removes the polymer backing film, leaving behind the metal film (e.g., the barrier and wetting layers) bonded to the interface surface. Steps 304-312 may be repeated any number of times to bond any number of metal films to the interface surface. The method 300 terminates at step 314.

Thus, a surface of an IC chip or a heat sink (or other surface requiring thermal interface to another object) may be prepared for direct application of a liquid metal or solder thermal interface material (such as a gallium-indium-tin alloy or other thermally conductive metal-based interface material). The method 300 enables deployment of a liquid metal (or solder) thermal interface in a manner that is, in some embodiments, easier and more cost effective than sputtering, plating or evaporating barrier and/or wetting layers directly onto an interface surface.

Thus, the present invention represents a significant advancement in the field of IC chip cooling. A liquid metal thermal interface is provided that facilitates improved thermal contact between an IC chip and a heat sink over conventional conductive paste interfaces. The thermal interface is assembled in a manner that substantially prevents reactions between materials in the liquid metal and materials in the IC chip and/or heat sink, as well as achieves sufficient wetting of the IC chip and heat sink surfaces. Thus, the thermal interface of the present invention makes deployment of the liquid metal a practical interface solution. Moreover, the present invention provides a simple, cost-effective method of deploying the liquid metal thermal interface between an IC chip and a heat sink (or between any two surfaces requiring good thermal contact).

While foregoing is directed to the preferred embodiment of the present invention, other and further embodiments of the invention may be devised without departing from the basic scope thereof, and the scope thereof is determined by the claims that follow.

The invention claimed is:

1. A method for adapting an interface surface for bonding to a liquid metal, the interface surface comprising a surface of an integrated circuit chip or a surface of a heat sink, said method comprising:
  applying an adhesive to said interface surface; and
  bonding a metal film to said adhesive, where said metal film is for bonding said liquid metal to said interface surface, wherein said bonding comprises:
    pressing said metal film to said adhesive, said metal film comprising:
      a barrier layer, said barrier layer comprising a substantially oxide-free foil that has a low solubility in said liquid metal; and
      a wetting layer, said wetting layer comprising at least one material that is at least partially dissolvable in said liquid metal and that coats at least a portion of said barrier layer; and
    curing said adhesive until said metal film is bonded to said adhesive.

2. The method of claim 1, wherein said barrier layer is formed of at least one of: titanium, tantalum, tungsten, chromium, molybdenum, silicon, silicon carbide, silicon nitride, silicon dioxide, titanium nitride, tantalum nitride or nickel.

3. The method of claim 1, wherein said wetting layer is formed of at least one noble metal.

4. The method of claim 1, wherein said wetting layer is formed of at least one of: platinum or gold.

5. The method of claim 1, wherein said metal film has a thickness of at least approximately 1000 Angstroms.

6. A method for adapting an interface surface for bonding to a liquid metal, the interface surface comprising a surface of an integrated circuit chip or a surface of a heat sink, said method comprising:
  applying an adhesive to said interface surface; and
  bonding a metal film to said adhesive, where said metal film is for bonding said liquid metal to said interface surface, wherein said bonding comprises:
    pressing said metal film to said adhesive, said metal film comprising:
      a polymer backing film; and
      a barrier layer evaporated onto said polymer backing film, said barrier layer comprising at least one material that has a low solubility in said liquid; and
    curing said adhesive until said metal film is bonded to said adhesive.

7. The method of claim 6, wherein said metal film further comprises:
  a wetting layer evaporated onto said polymer backing film beneath said barrier layer, said wetting layer comprising at least one material that is at least partially dissolvable in said liquid metal.

8. The method of claim 6, wherein said bonding further comprises:
  peeling said polymer backing film from said metal film after curing said adhesive.

9. The method of claim 6, wherein said polymer backing film is formed of a polyester film.

10. The method of claim 6, wherein said metal film has a thickness of approximately one to twenty microns.

11. The method of claim 6, wherein said polymer backing film is formed of at least one of: polyethylene terephthalate or polytetrafluoroethylene.

12. The method of claim 1, wherein said adhesive is at least one of: a low viscosity acrylate, an epoxy, a low-melt solder or an indium-based solder.

13. The method of claim 1, further comprising:
  applying an adhesion promoter to said interface surface prior to applying said adhesive.

14. The method of claim 1, wherein said adhesive is cured using at least one of: heat and light.

15. The method of claim 14, wherein said adhesive is cured at a temperature of at least approximately 250 degrees Celsius.

16. The method of claim 6, wherein said adhesive is at least one of: a low viscosity acrylate, an epoxy, a low-melt solder or an indium-based solder.

17. The method of claim 6, further comprising:
  applying an adhesion promoter to said interface surface prior to applying said adhesive.

18. The method of claim 6, wherein said adhesive is cured using at least one of: heat and light.

19. The method of claim 18, wherein said adhesive is cured at a temperature of at least approximately 250 degrees Celsius.

* * * * *